(12) United States Patent
Furukawa et al.

(10) Patent No.: US 12,078,686 B2
(45) Date of Patent: Sep. 3, 2024

(54) ELECTRIC LEAKAGE DETECTION METHOD

(71) Applicant: Prime Planet Energy & Solutions, Inc., Tokyo (JP)

(72) Inventors: Kimihiko Furukawa, Kakogawa (JP); Junya Yano, Kato (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 0 days.

(21) Appl. No.: 18/059,430

(22) Filed: Nov. 29, 2022

(65) Prior Publication Data
US 2023/0168314 A1 Jun. 1, 2023

(30) Foreign Application Priority Data
Dec. 1, 2021 (JP) .................. 2021-195289

(51) Int. Cl.
*G01R 31/52* (2020.01)
*G01R 31/40* (2020.01)
(52) U.S. Cl.
CPC ............. *G01R 31/52* (2020.01); *G01R 31/40* (2013.01)
(58) Field of Classification Search
CPC .. G01R 31/52; G01R 31/40; G01R 19/16542; G01R 31/007; G01R 31/396; G01R 31/3842; H01M 10/488
(Continued)

(56) References Cited

U.S. PATENT DOCUMENTS 11,131,717 B1 * 9/2021 Fasching ............... H02J 7/0048
2005/0264264 A1 12/2005 Yano et al.
(Continued)

FOREIGN PATENT DOCUMENTS

JP H06-153301 A 5/1994
JP H08-294225 A 11/1996
(Continued)

*Primary Examiner* — Giovanni Astacio-Oquendo
(74) *Attorney, Agent, or Firm* — HAUPTMAN HAM, LLP

(57) ABSTRACT

The electric leakage detection method disclosed herein includes: total voltage measurement of measuring a total voltage $V_t$ which is an electrical potential difference between a total positive terminal open to be connectable with an external device and a total negative terminal open to be connectable with the external device; electric leakage voltage measurement of measuring an electric leakage voltage $V_L$ which is an electrical potential difference between a reference terminal (the total negative terminal) and the electric leakage occurring position (the third single battery); and an electric leakage occurring position determination of determining the electric leakage occurring position by calculating a ratio ($V_L/V_t$) of the electric leakage voltage $V_L$ to the total voltage $V_t$. This allows the number of single batteries between the reference terminal and the electric leakage occurring position to be estimated, and a detailed electric leakage occurring position to be determined.

10 Claims, 4 Drawing Sheets

(58) Field of Classification Search
USPC ..................................... 324/522, 512, 500
See application file for complete search history.

(56) References Cited

U.S. PATENT DOCUMENTS

| | | | |
|---|---|---|---|
| 2006/0006840 A1 | 1/2006 | Furukawa | |
| 2007/0285057 A1* | 12/2007 | Yano | ................ B60L 3/12 |
| | | | 320/116 |
| 2009/0079434 A1 | 3/2009 | Osawa et al. | |
| 2010/0308836 A1* | 12/2010 | Buchel | ............ G01R 31/396 |
| | | | 324/434 |
| 2013/0063152 A1* | 3/2013 | Kasashima | ........... G01R 31/52 |
| | | | 324/509 |
| 2019/0245252 A1* | 8/2019 | Mäki | .............. G01R 31/392 |
| 2021/0055356 A1* | 2/2021 | Stafl | .............. G01R 31/3842 |

FOREIGN PATENT DOCUMENTS

| | | |
|---|---|---|
| JP | 2005-338010 A | 12/2005 |
| JP | 2006-025502 A | 1/2006 |
| JP | 2007149561 A | 6/2007 |
| JP | 2007327856 A | 12/2007 |
| JP | 2009-081964 A | 4/2009 |
| JP | 4785627 A | 10/2011 |
| JP | 4785627 B2 | 10/2011 |
| JP | 1963827 B2 | 6/2012 |
| JP | 4963827 B2 | 6/2012 |
| JP | 2013-134120 A | 7/2013 |
| JP | 2016-038357 A | 3/2016 |
| JP | 2020-134295 A | 8/2020 |

\* cited by examiner

ELECTRIC LEAKAGE DETECTION METHOD

CROSS REFERENCE TO RELATED APPLICATIONS

The present application is based upon and claims the benefit of priority from Japanese patent application No. 2021-195289 filed on Dec. 1, 2021, and the entire disclosure of which is incorporated herein its entirety by reference.

BACKGROUND

1. Technical Field

The present disclosure relates to an electric leakage detection method. Specifically, the present disclosure relates to an electric leakage detection method of detecting an electric leakage occurring position in a power source unit including multiple power sources electrically connected to each other.

2. Description of the Related Art

Power sources such as secondary batteries and power generation elements may be used as a power source unit including multiple power sources connected to each other. This type of power source unit is insulated from ground for safety reasons because the output voltage is very high. However, depending on the conditions of use, electric leakage may occur between the ground and the power source due to failure of the power source or contamination by foreign matter (e.g., moisture and metal pieces). In such a case, it is required to determine the electric leakage occurring position in an early stage and perform repairing such as replacing parts or removing foreign substances. Thus, an electric leakage detection technology of detecting an electric leakage in a power source unit by measuring an electric resistance of an insulating portion may be used.

For example, JP 2007-327856 discloses an electric leakage detection circuit for electric vehicles. In JP 2007-327856, an assembled battery (power source unit) including multiple secondary batteries (power sources) is an inspection target. The electric leakage detection circuit includes: a first electric leakage detection switch connected to a high voltage side of the assembled battery; a second electric leakage detection switch connected to a low voltage side; a control circuit configured to alternately switch on and off of the first electric leakage detection switch and the second electric leakage detection switch; an electric leakage detection resistor connected to the assembled battery via the first electric leakage detection switch and the second electric leakage detection switch and connected to ground at its midpoint; a voltage detection circuit configured to detect electric leakage voltages on the high voltage side and the low voltage side of the electric leakage detection resistor from the ground; and an arithmetic circuit configured to calculate an output of the voltage detection circuit and detect an electric leakage. The electric leakage detection circuit detects a first electric leakage voltage with the first electric leakage detection switch on and the second electric leakage detection switch off. The electric leakage detection circuit detects a second electric leakage voltage with the first electric leakage detection switch OFF and the second electric leakage detection switch ON. The arithmetic circuit of the electric leakage detection circuit detects an electric leakage resistance based on the first electric leakage voltage, the second electric leakage voltage, and a total voltage of the assembled battery.

JP 2007-149561 discloses another example of the electric leakage detection circuit. In JP 2007-149561, the assembled battery is an inspection target. The electric leakage detection circuit includes multiple circuit blocks, a resistance voltage detection circuit, a control circuit, and an electric leakage determination circuit. The circuit blocks are connected to connection points between multiple battery units and connects the connection points to the ground via a measurement resistor and a series circuit of a switching element. The resistance voltage detection circuit detects measurement resistance voltages of the circuit blocks. The control circuit controls the switching element of each circuit block. The electric leakage determination circuit detects an electric leakage based on the detected voltages of the resistance voltage detection circuit. In the electric leakage detection circuit with such a configuration, switching elements of the circuit blocks are sequentially switched ON/OFF, and detects a circuit block for which a voltage at a measurement resistance is detected by the resistance voltage detection circuit. This allows the battery unit with an electric leakage occurring to be determined.

SUMMARY

However, there is room for improvement in the above-mentioned electric leakage detection technology, and there is a need for a technology of determining an electric leakage occurring position in detail at low cost and in a simplified manner.

For example, the technology described in JP 2007-327856 uses a single voltage detection circuit. Thus, an occurrence of electric leakage can be detected at low cost and in a simplified manner. However, in the technology described in JP 2007-327856, it is difficult to determine which portion of many secondary batteries (power sources) is causing an electric leakage. Specifically, the technology described in JP 2007-327856 determines that an electric leakage is occurring when the electric leakage resistance calculated falls below a predetermined threshold value. However, the technology described in JP 2007-327856 does not determine a detailed electric leakage occurring position. Therefore, it is difficult to determine the position to be repaired by using only the technology described in JP 2007-327856. In other words, the technology described in JP 2007-327856 needs to use another technology of determining a detailed electric leakage occurring position in combination.

The technology described in JP 2007-149561 detects an electric leakage while sequentially switching ON/OFF of circuit blocks connected between multiple battery units. This allows the electric leakage occurring position to be determined by the battery units (multiple batteries connected in series). However, in order to determine the detailed electric leakage occurring position at the level of single power source by using this type of electric leakage detection technology, all of many (e.g., around 100) power sources need to be provided with circuit blocks. Therefore, the technology described in JP2007-149561 causes the electric leakage detection circuit to be more complex and expensive.

The present disclosure was made to solve the problems, and intended to provide a technology capable of determining a detailed electric leakage occurring position at low cost and in a simplified manner.

In order to achieve the objective, an electric leakage detection method disclosed herein is provided.

The electric leakage detection method disclosed herein detects an electric leakage occurring position in a power source unit including multiple power sources electrically connected to each other. The electric leakage detection method includes: electric leakage voltage measurement of calculating an electric leakage voltage $V_L$ which is an electrical potential difference between a reference terminal connected to a predetermined position of the power source unit and the electric leakage occurring position; and electric leakage occurring position determination of determining the electric leakage occurring position based on the electric leakage voltage $V_L$.

The electric leakage detection method disclosed herein is a method focused on the electric leakage voltage $V_L$ which is an electrical potential difference between the reference terminal connected to any position of the power source unit and the electric leakage occurring position. Specifically, when an electric leakage is occurring at a position far from the reference terminal in the power source unit with a commonly used configuration, the number of power sources between the reference terminal and the electric leakage occurring position increases. In this case, the electric leakage voltage $V_L$ increases. On the other hand, when an electric leakage is occurring at a position near the reference terminal, the number of power sources between the reference terminal and the electric leakage occurring position decreases. In this case, the electric leakage voltage $V_L$ decreases. Therefore, by calculating the electric leakage voltage $V_L$, the number of power sources between the reference terminal and the electric leakage occurring position can be estimated, and the electric leakage occurring position can be determined in a simplified manner. In the electric leakage detection method disclosed herein, the electric leakage occurring position can be determined by detecting the electrical potential difference (the electric leakage voltage $V_L$) between the reference terminal and the electric leakage occurring position. Thus, there is no need to provide electric leakage detection circuits for all of the power sources. As described above, the electric leakage detection method disclosed herein can determine a detailed electric leakage occurring position at low cost and in a simplified manner.

An aspect of the electric leakage detection method disclosed herein, the electric leakage detection method further includes: reference electrical potential difference obtaining of obtaining a reference electrical potential difference $V_S$ which is an electrical potential difference between a first terminal connected to a predetermined position of the power source unit and a second terminal connected to a portion with a different electrical potential from the first terminal. The electric leakage voltage measurement includes: selecting either one of the first terminal or the second terminal as the reference terminal; and calculating an electric leakage voltage $V_L$ which is an electrical potential difference between the reference terminal and the electric leakage occurring position, and the electric leakage occurring position determination includes determining the electric leakage occurring position based on a ratio $(V_L/V_S)$ of the electric leakage voltage $V_L$ to the reference electrical potential difference $V_S$. In the present aspect, the number of power sources between the first terminal and the second terminal connected is constant. Thus, the reference electrical potential difference $V_S$ between the first terminal and the second terminal is less susceptible to electric leakage and charging conditions. Therefore, by calculating the ratio $(V_L/V_S)$ between the electric leakage voltage $V_L$ and the reference electrical potential difference $V_S$, the number of power sources between the reference terminal and the electric leakage occurring position can be more accurately determined.

In an aspect of the electric leakage detection method disclosed herein, the power source unit further includes an electric leakage detection circuit, and the electric leakage detection circuit includes a reference electrical potential difference detection unit connected between the first terminal and the second terminal and is configured to detect the reference electrical potential difference $V_S$; and an electric leakage voltage detection unit connected to the first terminal and the second terminal and connected to ground at its midpoint, and configured to detect a first ground voltage $V_{g(t1)}$ corresponding to an electrical potential difference between the first terminal via the ground and the electric leakage occurring position and a second ground voltage $V_{g(t2)}$ corresponding to an electrical potential difference between the second terminal via the ground and the electric leakage occurring position is used. The use of the electric leakage detection circuit with such a configuration allows accurate detection of the first ground voltage $V_{g(t1)}$, the second ground voltage $V_{g(t2)}$, and the reference electrical potential difference $V_S$. As a result, an electric leakage voltage $V_L$ can be detected based on the accurate detection result.

In an aspect of the electric leakage detection method disclosed herein, an electric leakage voltage detection unit includes: a first switch connected to the first terminal side; a first voltage detection resistor provided between the first switch and the midpoint; a second switch connected to the second terminal side; and a second voltage detection resistor provided between the second switch and the midpoint. The electric leakage voltage detection unit with such a configuration allows more accurate detection of the first ground voltage $V_{g(t1)}$ and the second ground voltage $V_{g(t2)}$.

In an aspect of the electric leakage detection method disclosed herein, the power source unit includes: a total positive terminal which is a positive electrode terminal open to be connectable with an external device; and a total negative terminal which is a negative electrode terminal open to be connectable with the external device, and the first terminal is connected to the total positive terminal, the second terminal is connected to the total negative terminal, and the total voltage $V_t$ of the power source unit which is an electrical potential difference between the total positive terminal and the total negative terminal is the reference electrical potential difference $V_S$. This allows the electric leakage occurring position to be determined in a more simplified manner.

In an aspect of the electric leakage detection method disclosed herein, the electric leakage voltage measurement includes: first measurement of measuring a first total voltage $V_{t(t1)}$ in the reference electrical potential difference detection unit while detecting the first ground voltage $V_{g(t1)}$ in the electric leakage voltage detection unit with the first switch ON and the second switch OFF; second measurement of measuring a second total voltage $V_{t(t2)}$ in the reference electrical potential difference detection unit while detecting the second ground voltage $V_{g(t2)}$ in the electric leakage voltage detection unit with the first switch OFF and the second switch ON; and electric leakage voltage calculation of calculating the electric leakage voltage $V_L$ based on the first ground voltage $V_{g(t1)}$, the first total voltage $V_{t(t1)}$, the second ground voltage $V_{g(t2)}$, and the second total voltage $V_{t(t2)}$. This allows a more accurate electric leakage voltage $V_L$ to be obtained.

In an aspect of the electric leakage detection method disclosed herein, the electric leakage voltage $V_L$ is calculated based on the following equations (1) and (2) with the total negative terminal used as a reference terminal. The calculation of the electric leakage voltage $V_L$ by synthesizing the first ground voltage $V_{g(t1)}$ and the second ground voltage $V_{g(t2)}$ as in the following equations allows a more accurate electric leakage voltage $V_L$ to be detected without being influenced by changes in total voltage due to charging/discharging.

[Math. 1]
$$V_L(t) = kV_t(t) \qquad (1)$$

[Math. 2]
$$k = \frac{\dfrac{V_t(t_1)}{V_t(t_2)}}{\dfrac{V_g(t_1)}{V_g(t_2)} + \dfrac{V_t(t_1)}{V_t(t_2)}} \qquad (2)$$

In an aspect of the electric leakage detection method disclosed herein, the electric leakage voltage $V_L$ is calculated based on the following equations (1)' and (2) with the total positive terminal used as a reference terminal. When the total positive terminal is used as a reference terminal, an accurate electric leakage voltage $V_L$ can be detected based on the following equations (1)' and (2) without being influenced by changes in total voltage due to charging/discharging.

[Math. 3]
$$V_L(t) = (1-k)V_t(t)' \qquad (1)$$

[Math. 4]
$$k = \frac{\dfrac{V_t(t_1)}{V_t(t_2)}}{\dfrac{V_g(t_1)}{V_g(t_2)} + \dfrac{V_t(t_1)}{V_t(t_2)}} \qquad (2)$$

In an aspect of the electric leakage detection method disclosed herein, the power source unit includes multiple connection members electrically connecting between two adjacent power sources, and the first terminal is connected to one of the connection members, and the second terminal is connected to the connection member different from the connection member connected to first terminal. Even in such an aspect where the total positive terminal and the total negative terminal are not used, the first ground voltage $V_{g(t1)}$, the second ground voltage $V_{g(t2)}$, and the reference electrical potential difference $V_S$ can be detected. Then, the electric leakage voltage $V_L$ can be detected, as appropriate, based on the detection results.

In an aspect of the electric leakage detection method disclosed herein, the electric leakage voltage $V_L$ is calculated based on the following equations (3) and (4) with the second terminal used as the reference terminal. In such an aspect where the total positive terminal and the total negative terminal are not used, an electric leakage voltage $V_L$ can be detected accurately based on the following equations.

[Math. 5]
$$V_L(t) = kV_S(t) \qquad (3)$$

[Math. 6]
$$k = \frac{\dfrac{V_S(t_1)}{V_g(t_1)}}{\dfrac{V_S(t_1)}{V_g(t_1)} - \dfrac{V_S(t_2)}{V_g(t_2)}} \qquad (4)$$

As another aspect of the technology disclosed herein, an electric leakage detection circuit configured to detect an electric leakage occurring position in a power source unit including multiple power sources electrically connected to each other. The electric leakage detection circuit disclosed herein includes: a reference terminal connected to a predetermined position of the power source unit; an electric leakage voltage detection unit configured to calculate an electric leakage voltage $V_L$ which is an electrical potential difference between the reference terminal and the electric leakage occurring position; and an electric leakage occurring position determination unit configured to determine the electric leakage occurring position based on the electric leakage voltage $V_L$. The electric leakage detection circuit with such a configuration can determine the electric leakage occurring position by merely detecting an electrical potential difference (an electric leakage voltage $V_L$) between the reference terminal and the electric leakage occurring position. As a result, there is no need to provide electric leakage detection circuits for all of the power sources. Accordingly, the electric leakage detection circuit disclosed herein can determine a detailed electric leakage occurring position at low cost and in a simplified manner.

DETAILED DESCRIPTION

The following describes embodiments of the technology disclosed herein. The matters necessary for executing the technology disclosed herein, except for matters specifically herein referred to (e.g., the detailed structure of the power source unit and parts used to construct the electric leakage detection circuit) can be grasped as design matters of those skilled in the art based on the related art in the preset field. The technology disclosed herein can be executed based on the contents disclosed herein and the technical knowledge in the present field. The expression "A to B" indicating herein a range means A or more to B or less, and also encompasses the meaning of "preferably more than A" and "preferably less than B."

First Embodiment

A first embodiment of the electric leakage detection method disclosed herein will be described below.
1. Power Source Unit The electric leakage detection method disclosed herein detects an electric leakage occurring position in a power source unit including multiple power sources electrically connected to each other. A "power source" herein refers to a device that is capable of supplying (discharging) electric power to at least outside. Examples of the power source include: secondary batteries such as a lithium-ion secondary battery, a nickel hydride battery, and a nickel cadmium battery; primary batteries such as a manganese dry battery and an alkali dry battery; capacitors such as an electric double-layer capacitor; and power generating elements such as a fuel battery and a solar battery. A unit including these power sources connected to each other is referred to as a "power source unit" herein. The power source unit can be, for example, an assembled battery including multiple secondary batteries electrically connected to each other. Each of the secondary batteries constituting the assembled battery is referred to as a "single battery" herein.

Figure 1:
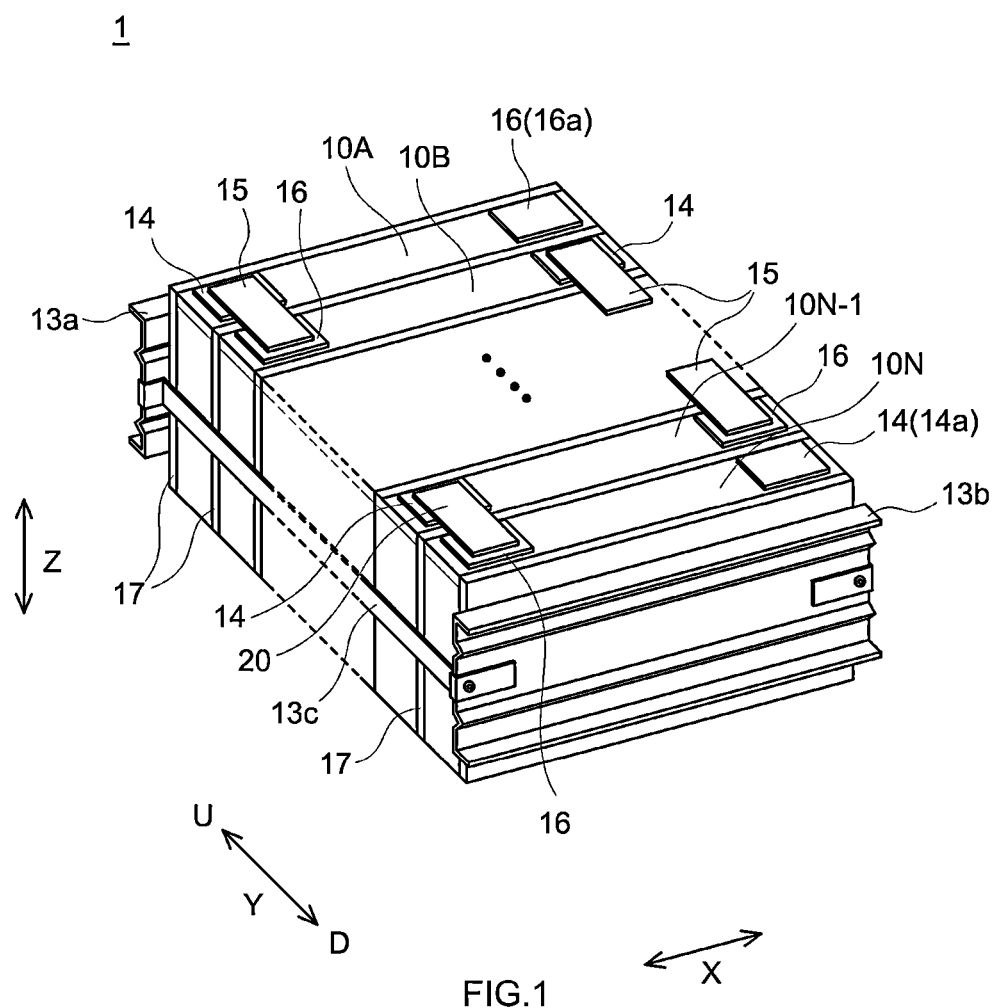
FIG. 1 is a perspective view schematically illustrating an example of a structure of an assembled battery.
Figure 2:
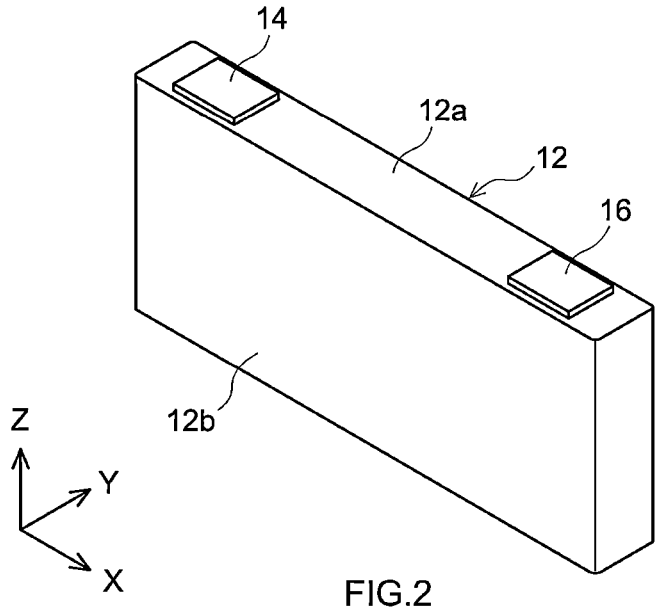
FIG. 2 is a perspective view schematically illustrating a single battery in FIG. 1.

Next, an embodiment where the assembled battery is an inspection target will be described. However, the following description is not intended to limit the inspection target in the electric leakage detection method disclosed herein to the assembled battery. FIG. 1 is a perspective view schematically illustrating an example of a structure of an assembled battery. FIG. 2 is a perspective view schematically illustrating a single battery in FIG. 1. In FIGS. 1 and 2, the reference sign X indicates "the width direction (of a single battery)," the reference sign Y indicates "the alignment direction (of a single battery)," and the reference sign Z indicates "the height direction (of a single battery)." In the alignment direction Y, U indicates an "upstream side," and D indicates a "downstream side." These directions are defined for convenience of explanation and are not intended to limit the technology disclosed herein.

An assembled battery (power source unit) 1 shown in FIG. 1 includes multiple (N) single batteries (power sources) 10A to 10N. Each of the single batteries 10A to 10N includes a battery case 12 which is a flat square container (see FIG. 2). The battery case 12 is made of a metal material having predetermined rigidity such as aluminum. Although not shown in the drawings, the battery case 12 houses an electrode body where charging/discharging reaction occurs and an electrolyte therein. A positive electrode terminal 14 and a negative electrode terminal 16 are attached to the upper surface 12a of the battery case 12. Although not shown in the drawings, the positive electrode terminal 14 is electrically connected to a positive electrode of the electrode body inside the battery case 12. An upper end of the positive electrode terminal 14 is exposed to the outside of the battery case 12. The negative electrode terminal 16 is electrically connected to a negative electrode of the electrode body inside the battery case 12. Similarly, an upper end of the negative electrode terminal 16 is exposed to the outside of the battery case 12. The single batteries are not limited to square batteries with the configuration described above. Specifically, the single battery may be a tubular battery having a cylindrical battery case, or a laminated battery where an electrode body is encapsulated into a resin-made laminate film.

As shown in FIG. 1, in the assembled battery 1, multiple single batteries 10A to 10N are aligned adjacent to each other along the predetermined alignment direction Y. Specifically, the single batteries 10A to 10N are arranged so that their long side surfaces 12b (see FIG. 2) of the respective battery cases 12 face each other. The single batteries 10A to 10N are bonded along the alignment direction Y. Specifically, in the assembled battery 1, a binding plate 13a is arranged at an upstream U end in the alignment direction X. A binding plate 13b is arranged at a downstream D end. The binding plates 13a, 13b in pair are bridged by a bridging member 13c. Thus, the single batteries 10A to 10N arranged between the binding plates 13a, 13b are bonded at a predetermined binding pressure along the alignment direction Y. In the assembled battery 1 shown in FIG. 1, a buffer plate 17 is inserted between adjacent single batteries. This allows uniform binding pressure to be applied to the long side surfaces 12b (see FIG. 2) of the battery cases 12. The structure related to the binding of single batteries does not limit the technology disclosed herein and can be changed, as appropriate, according to the structure of the assembled battery.

The assembled battery 1 shown in FIG. 1 includes: multiple connection members 15 electrically connecting between adjacent two single batteries. Specifically, the single batteries 10A to 10N are arranged such that the positive electrode terminal 14 of one of the adjacent two single batteries comes close to the negative electrode terminal 16 of the other single battery. The positive electrode terminal 14 of one single battery is electrically connected to the negative electrode terminal 16 of the other single battery via a connection member 15. This allows each of the single batteries 10A to 10N constituting the assembled battery 1 to be connected in series. The positive electrode terminal 14 of the n-th single battery 10N arranged at the downstream D end in the alignment direction Y is not connected to the adjacent single battery 10N-1. The positive electrode terminal 14 of the n-th single battery 10N is a total positive terminal 14a open to be connectable to an external device (e.g., a vehicle). Similarly, the negative electrode terminal 16 of the first single battery 10A arranged at the upstream U end in the alignment direction Y is not connected to the adjacent single battery 10B. The negative electrode terminal 16 of the first single battery 10A is a total negative terminal 16a open to be connectable to an external device.

The number of single batteries constituting the assembled battery is not particularly limited and can be changed, as appropriate, according to the performance (e.g., an output voltage, an installation space) required for the assembled battery. Although described in detail later, the technology disclosed herein allows an electric leakage occurring position in an assembled battery (power source unit) including a great number of single batteries (power sources) to be determined accurately in a simplified manner. Thus, the technology disclosed herein is suitably applicable to particularly determining of an electric leakage occurring position in an assembled battery including many single batteries. For example, the technology disclosed herein is applicable to an assembled battery including 50 or more (more suitably 75 or more), yet more suitably 90 or more, particularly suitably 100 or more single batteries. Even if the assembled battery includes many single batteries, an electric leakage occurring position can be determined accurately without providing a complicated electric leakage detection circuit.

The upper limit of the number of single batteries constituting the assembled battery is not particularly limited, and may be 200 or less, or 150 or less.

2. Configuration of Electric Leakage Detection Circuit

Figure 3:
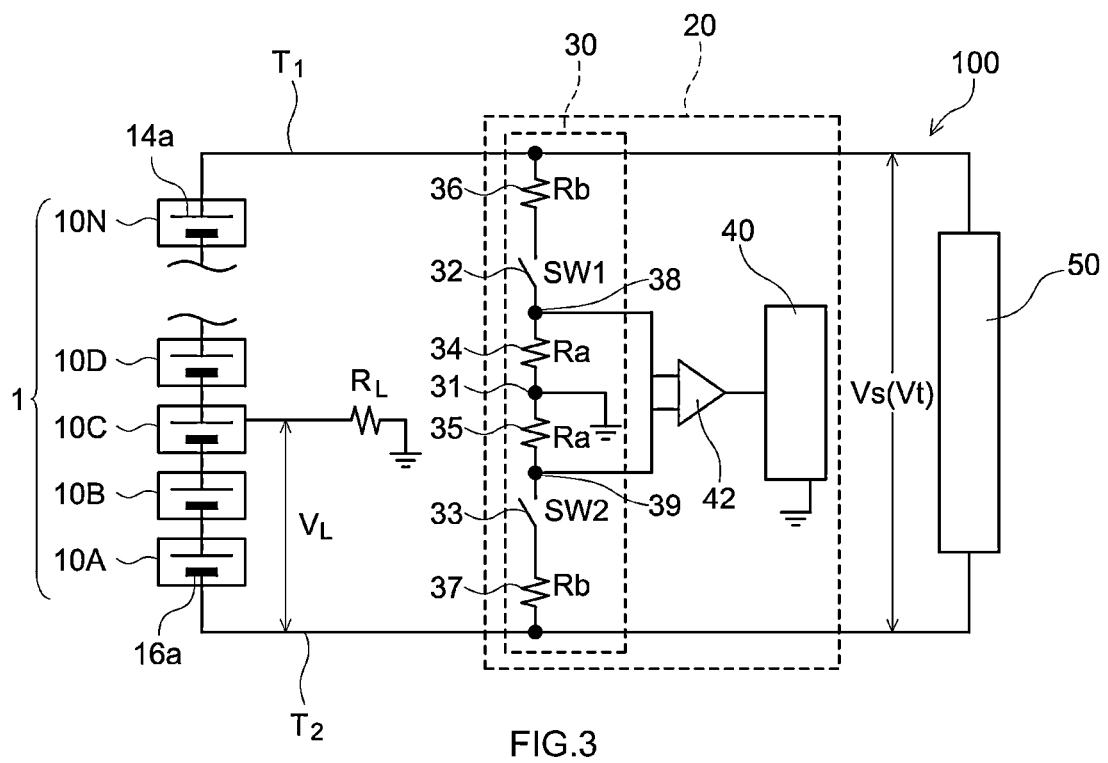
FIG. 3 is a circuit diagram illustrating an electric leakage detection circuit for performing an electric leakage detection method according to first and second embodiment.

Next, an electric leakage detection circuit for performing an electric leakage detection method according to a first embodiment will be described. FIG. 3 is a circuit diagram illustrating an electric leakage detection circuit for performing an electric leakage detection method according to first and second embodiment. For convenience of explanation, FIG. 3 shows, as an example, the state where an electric leakage is occurring in the third single battery 10C (the state where the third single battery 10C and the ground are conducted with each other). Although described in detail later, the electric leakage detection method disclosed herein requires the reference terminal to be connected to a predetermined position of the power source unit. In the present embodiment, the first terminal $T_1$ is connected to the total positive terminal 14a of the assembled battery 1. Further, the second terminal $T_2$ is connected to the total negative terminal 16a. In the present embodiment, the second terminal $T_2$ is selected as the reference terminal.

An electric leakage detection circuit 100 shown in FIG. 3 includes: an electric leakage voltage detection unit 20 and a reference electrical potential difference detection unit 50. Each unit will be described below.

(1) Electric Leakage Voltage Detection Unit

The electric leakage voltage detection unit 20 detects an electric leakage voltage $V_L$ which is an electrical potential difference between the reference terminal and the electric leakage occurring position. In an aspect shown in FIG. 3, the second terminal $T_2$ connected to the total negative terminal 16a is used as the reference terminal. In such a case, the electrical potential difference between the total negative terminal 16a and the third single battery 10C is the electric leakage voltage $V_L$. The electric leakage voltage detection unit 20 configured to detect an electric leakage voltage $V_L$ includes: an electric leakage detection resistor 30; and a voltage detection unit 40.

The electric leakage detection resistor 30 is connected to the first terminal $T_1$ and the second terminal $T_2$. The electric leakage detection resistor 30 is connected to the ground at a midpoint 31. That is, the midpoint 31 of the electric leakage detection resistor 30 is conducted with the electric leakage occurring position via the ground when an electric leakage occurs in the assembled battery 1. The electric leakage voltage detection unit 20 is configured to detect a first ground voltage $V_{g(t1)}$ and a second ground voltage $V_{g(t2)}$. The first ground voltage $V_{g(t1)}$ is an electrical potential difference between a first terminal $T_1$ (a total positive terminal 14a) via the ground and the electric leakage occurring position. The second ground voltage $V_{g(t2)}$ is an electrical potential difference between a second terminal $T_2$ (a total negative terminal 16a) via the ground and the electric leakage occurring position. The electric leakage detection resistor 30 of the electric leakage voltage detection unit 20 is provided with two switching elements including a first switch 32 and a second switch 33; and four resistors including a first voltage detection resistor 34, a second voltage detection resistor 35, a first voltage dividing resistor 36, and a second voltage dividing resistor 37.

The first switch 32 is a switching element connected to a position closer to the first terminal $T_1$ than to the midpoint 31. The second switch 33 is a switching element connected to a position closer to the second terminal $T_2$ than to the midpoint 31. The structures of the switching elements are not particularly limited, and a semiconductor switching element such as a transistor and FET or mechanical switch such as a relay can be used. Although not shown in the drawings, the first switch 32 and the second switch 33 are connected to a control unit that controls the operation of the electric leakage detection circuit 100. The first switch 32 and the second switch 33 are configured to switch ON/OFF by a signal from the control unit. Although described in detail later, the control unit of the electric leakage detection circuit 100 controls operation of each switching element such that the second switch 33 is OFF when the first switch 32 is ON, and the first switch 32 is OFF when the second switch 33 is ON.

Next, four resistors of the electric leakage detection resistor 30 will be described. The first voltage detection resistor 34 is a resistor provided between the first switch 32 and the midpoint 31. The second voltage detection resistor 35 is a resistor provided between the second switch 33 and the midpoint 31. The first voltage dividing resistor 36 is a resistor provided between the first terminal $T_1$ (the total positive terminal 14a) and the first switch 32. The second voltage dividing resistor 37 is a resistor provided between the second terminal $T_2$ (the total negative terminal 16a) and the second switch 33. In the electric leakage detection circuit 100 shown in FIG. 3, the first voltage detection resistor 34 and the second voltage detection resistor 35 are set to the same electric resistance Ra. The first voltage dividing resistor 36 and the second voltage dividing resistor 37 are set to the same electric resistance Rb. However, the resistors may have different electric resistances.

Next, the voltage detection unit 40 is connected to the electric leakage detection resistor 30 via a differential arithmetic circuit 42. Specifically, the voltage detection unit 40 is connected to the electric leakage detection resistor 30 at a first connection point 38 provided between the first switch 32 and the first voltage detection resistor 34 and a second connection point 39 provided between the second switch 33 and the second voltage detection resistor 35. The voltage detection unit 40 detects a first ground voltage Vo) and a second ground voltage $V_{g(t2)}$ based on a voltage input from the electric leakage detection resistor 30. Although described in detail later, by switching ON/OFF of the first switch 32 and the second switch 33 in the electric leakage detection resistor 30, the first ground voltage $V_{g(t1)}$ which is an electrical potential difference between the first terminal $T_1$ (the total positive terminal 14a) via the ground and the electric leakage occurring position and the second ground voltage $V_{g(t2)}$ which is an electrical potential difference between the second terminal $T_2$ (the total negative terminal 16a) via the ground and the electric leakage occurring position. The first ground voltage Vo) and the second ground voltage $V_{g(t2)}$ are used to calculate the electric leakage voltage $V_L$.

In the circuit shown in FIG. 3, the first ground voltage Vo) divided by the first voltage dividing resistor 36 and the first voltage detection resistor 34 is input to the voltage detection unit 40. Similarly, the second ground voltage $V_{g(t2)}$ divided by the second voltage dividing resistor 37 and the second voltage detection resistor 35 is input to the voltage detection unit 40 via the differential arithmetic circuit 42. By providing the voltage dividing resistor in this manner, the voltage input to the voltage detection unit 40 can be controlled. Specifically, by setting the electric resistance of the voltage dividing resistor to be larger than the electric resistance of the voltage detection resistor, the voltage input to the voltage detection unit 40 can be reduced. This reduces the voltage input to parts (e.g., an amplifier) constituting the voltage detection unit 40 to a few V, and allows avoidance of direct input of the high voltage of several hundred V from the assembled battery 1. As a result, a commonly used part for signal processing can be used as a component of the voltage detection unit 40. This allows further reduction in cost required for detection of the electric leakage occurring position.

(2) Reference Electrical Potential Difference Detection Unit

Although described in detail later, the electric leakage detection method according to the present embodiment determines the electric leakage occurring position based on the ratio ($V_L/V_S$) of the electric leakage voltage $V_L$ to the reference electrical potential difference $V_S$. Thus, the electric leakage detection circuit 100 shown in FIG. 3 is provided with a reference electrical potential difference detection unit 50 configured to detect the reference electrical potential difference $V_S$. The reference electrical potential difference detection unit 50 is a circuit connected between the first terminal $T_1$ and the second terminal $T_2$ and configured to detect the reference electrical potential difference $V_S$. As shown in FIG. 3, the reference electrical potential difference detection unit 50 in the first embodiment is connected between the first terminal $T_1$ connected to the total positive terminal 14a and the second terminal $T_2$ connected to the total negative terminal 16a. Thus, the reference electrical potential difference $V_S$ in the reference electrical potential difference detection unit 50 is a "total voltage $V_t$ of the assembled battery 1" which is a sum of voltages of the single batteries 10A to 10N. The specific structure of the reference electrical potential difference detection unit 50 is not particularly limited, and a known voltage detection unit is applicable without particular limitations. Similarly to the electric leakage voltage detection unit 20, it is preferred that the reference electrical potential difference detection unit 50 is connected to the control unit (not shown), and a timing when the total voltage $V_t$ (the reference electrical potential difference $V_S$) is measured is controlled.

(3) Electric Leakage Occurring Position Determination Unit

The electric leakage detection circuit 100 according to the present embodiment includes an electric leakage occurring position determination unit configured to determine the electric leakage occurring position based on the electric leakage voltage $V_L$. Although not shown in the drawings, the electric leakage occurring position determination unit is connected to the voltage detection unit 40 and the reference electrical potential difference detection unit 50, and is configured to perform the electric leakage detection method described below, based on information (typically the voltage) transmitted from the voltage detection unit 40 and the reference electrical potential difference detection unit 50.

3. Electric Leakage Detection Method

An example of the electric leakage detection method disclosed herein will be described below with reference to the electric leakage detection circuit 100 shown in FIG. 3. Specifically, the electric leakage detection method disclosed herein determines an electric leakage occurring position based on the electric leakage voltage $V_L$. In the electric leakage detection method according to the first embodiment, a ratio ($V_L/V_S$) of the electric leakage voltage $V_L$ to the reference electrical potential difference $V_S$ is calculated to accurately determine the electric leakage occurring position based on the electric leakage voltage $V_L$, and the electric leakage occurring position is determined based on the ratio ($V_L/V_S$). The electric leakage detection method according to the first embodiment includes reference electrical potential difference obtaining, electric leakage voltage measurement, and electric leakage occurring position determination. Each process will be described below.

(1) Reference Electrical Potential Difference Obtaining

The electric leakage detection method according to the first embodiment includes reference electrical potential difference obtaining of obtaining a reference electrical potential difference $V_S$ which is an electrical potential difference between the first terminal $T_1$ and the second terminal $T_2$. As mentioned above, in the present embodiment, the first terminal $T_1$ is connected to the total positive terminal 14a of the assembled battery 1, and the second terminal $T_2$ is connected to the total negative terminal 16a. Thus, the reference electrical potential difference $V_S$ measured in the reference electrical potential difference detection unit 50 is a total voltage $V_t$ of the assembled battery 1. The electric leakage detection method according to the present embodiment uses the first total voltage $V_{t(t1)}$ and the second total voltage $V_{t(t1)}$ measured at different timings $T_1$ and $T_2$ in the electric leakage voltage measurement to be described later. When the assembled battery 1 with small variations of total voltage is targeted for measurement, either one of the first total voltage $V_{t(t1)}$ or the second total voltage We) may be regarded as the "reference electrical potential difference $V_S$". The average value of the first total voltage $V_{t(t1)}$ and the second total voltage $V_{t(t2)}$ may be regarded as a "reference electrical potential difference $V_S$," or a total voltage detected at a different timing from the first total voltage $V_{t(t1)}$ and the second total voltage $V_{t(t2)}$ may be regarded as a "reference electrical potential difference $V_S$." Although described in detail later, the reference electrical potential difference $V_S$ may be an electrical potential difference between the first terminal $T_1$ and the second terminal $T_2$ set arbitrary, and is not limited to the total voltage $V_t$ of the assembled battery.

(2) Electric Leakage Voltage Measurement

In the electric leakage voltage measurement, an electric leakage voltage $V_L$, which is an electrical potential difference between the reference terminal connected to a predetermined position of the power source unit and the electric leakage occurring position. In the case where the first terminal $T_1$ and the second terminal $T_2$ are connected to the power source unit (the assembled battery 1) such as in the present embodiment, either one of the first terminal $T_1$ or the second terminal $T_2$ is preferably selected as a reference terminal. The following describes the case where the second terminal $T_2$ connected to the total negative terminal 16a is used as a reference terminal as an example as a matter of convenience.

In the electric leakage voltage measurement, a voltage generated from the electric leakage occurring position via the electric leakage resistor RL is measured, and an electric leakage voltage $V_L$, is calculated based on the measured voltage. For example, in the electric leakage detection circuit 100 shown in FIG. 3, the electric leakage voltage $V_L$, is calculated based on the ground voltage measured by the electric leakage voltage detection unit 20 and the reference electrical potential difference $V_S$ (the total voltage $V_t$ of the assembled battery) measured by the reference electrical potential difference detection unit 50. The following describes specific processes of the electric leakage voltage measurement.

In the electric leakage voltage measurement, firstly, a first measurement of measuring a voltage input to the voltage detection unit 40 at a first timing $T_1$ when the first switch 32 is turned ON and the second switch 33 is turned OFF is performed. At this time, when an electric leakage occurring position is present in the assembled battery 1, the electric leakage occurring position (in the third single battery 10C) and the first terminal $T_1$ are conducted with each other via the ground and the electric leakage resistor RL, and the first ground voltage $V_{g(t1)}$ is measured by the voltage detection unit 40. In the first measurement of the present embodiment, the first total voltage $V_{g(t1)}$ is measured by the reference electrical potential difference detection unit 50 at the timing when the first ground voltage $V_{g(t1)}$ is measured.

In this process, next, a second measurement of measuring a voltage input to the voltage detection unit 40 at a second timing $T_2$ when the first switch 32 is turned OFF and the second switch 33 is turned ON is performed. At this time, when an electric leakage occurring position is present in the assembled battery 1, the electric leakage occurring position (in the third single battery 10C) and the second terminal $T_2$ are conducted with each other via the ground and the electric leakage resistor RL, and the second ground voltage $V_{g(t2)}$ is measured by the voltage detection unit 40. In the second measurement of the present embodiment, the second total voltage $V_{g(t2)}$ is measured by the reference electrical potential difference detection unit 50 at the timing when the second ground voltage $V_{g(t2)}$ is measured.

In the electric leakage voltage measurement of the present embodiment, electric leakage voltage calculation of calculating the electric leakage voltage $V_L$ based on the first ground voltage $V_{g(t1)}$, the first total voltage $V_{g(t1)}$, the second ground voltage $V_{g(t2)}$, and the second total voltage $V_{g(t2)}$ is performed.

In this calculation of the electric leakage voltage, a value of the electric leakage resistor RL may first be calculated based on the following equation (5). In the equation (5), "Ra" represents the electric resistance of the electric resistances of the first voltage detection resistor 34 and the second voltage detection resistor 35, and "Rb" represents the electric resistances of the first voltage dividing resistor 36 and the second voltage dividing resistor 37.

[Math. 7]

$$RL = \frac{Ra}{\frac{Vg(t1)}{Vt(t1)} + \frac{Vg(t2)}{Vt(t2)}} - (Ra + Rb) \quad (5)$$

Next, in this process, the electric leakage voltage $V_L$, is calculated based on the following equations (1) and (2). As mentioned above, the electric leakage voltage $V_L$, is an electrical potential difference between the reference terminal (the second terminal $T_2$ connected to the total negative terminal 16a) and the electric leakage occurring position. The total voltage $V_t$ which is the reference electrical potential difference $V_S$ of the present embodiment is an electrical potential difference between the total positive terminal 14a and the total negative terminal 16a. Thus, the relationship between the electric leakage voltage $V_L$ and the total voltage $V_t$ can be represented by the following equation (1). The "k" in the following equation (1) represents the ratio ($V_L/V_t$) of the electric leakage voltage $V_L$ to the total voltage $V_t$, and is a numerical value in the range of 0 or more to 1 or less.

[Math. 8]

$$V_L(t) = kV_t(t) \quad (1)$$

In the equation (1), "k" can be calculated by the following equation (2). At this time, in the present embodiment, the first ground voltage $V_{r(t1)}$ as a reference of the first terminal $T_1$ and the second ground voltage $V_{r(t2)}$ as a reference of the second terminal $T_2$ are measured at different timings, and these ground voltages are synthesized by the equation (2). This reduces the influence of variations in total voltage $V_t$ and electric leakage voltage $V_L$ due to charging/discharging, electric leakage, and the like, and the ratio ($k=V_L/V_t$) of the electric leakage voltage $V_L$ to the total voltage $V_t$ can be calculated accurately.

[Math. 9]

$$k = \frac{\frac{V_t(t_1)}{V_t(t_2)}}{\frac{V_g(t_1)}{V_g(t_2)} + \frac{V_t(t_1)}{V_t(t_2)}} \quad (2)$$

(3) Electric Leakage Occurring Position Determination

In this process, the electric leakage occurring position is determined based on the electric leakage voltage $V_L$. In the electric leakage occurring position determination of the present embodiment, the ratio ($V_L/V_S$) of the electric leakage voltage $V_L$ to the reference electrical potential difference $V_S$ is calculated, and the electric leakage occurring position is determined based on the ratio ($V_L/V_S$). For example, in the present embodiment, the total voltage $V_t$ of the assembled battery is used as a reference electrical potential difference $V_S$. Thus, the ratio k ($=V_L/V_t$) of the electric leakage voltage $V_L$ to the total voltage $V_t$ is calculated by the equation (2). An electric potential from the reference terminal to the electric leakage occurring position can be accurately determined in a simplified manner based on the ratio k of the electric leakage voltage $V_L$ to the total voltage $V_t$. For example, in the case where, in an assembled battery (total voltage $V_t$: about 355 V) where 96 batteries of 3.7 V are connected in series, the electric leakage voltage $V_L$ is 100 V with the total negative terminal used as the reference terminal, the $V_L/V_S$ is 0.28. In this case, 96 (batteries)×($V_L/V_S$)=27.04. Based on the calculation results, it can be determined that an electric leakage is occurring in the vicinity of the 27th single battery (e.g., a single battery body and a connection member) viewed from the total negative terminal connected to the reference terminal (the second terminal $T_2$).

As described above, in the electric leakage detection method according to the present embodiment, the number of single batteries between the reference terminal and the electric leakage occurring position is estimated based on the electric leakage voltage $V_L$, and the electric leakage occurring position is determined. In the electric leakage detection method according to the present embodiment, the electric leakage occurring position can be determined by merely measuring the first ground voltage $V_{r(t1)}$ and the second ground voltage $V_{r(t2)}$. Thus, there is no need to provide electric leakage detection circuits for all of the single batteries 10A to 10N. As described above, the electric leakage detection method according to the present embodiment can determine a detailed electric leakage occurring position at low cost and in a simplified manner.

In the first embodiment, the electric leakage occurring position is determined based on the ratio ($V_L/V_S$) of the electric leakage voltage $V_L$ to the reference electrical potential difference $V_S$. The number of power sources 10A to 10N between the first terminal $T_1$ and the second terminal $T_2$ used in detection of the reference electrical potential difference $V_S$ is constant. Thus, the reference electrical potential difference $V_S$ is less susceptible to the electric leakage occurring position and can accurately reflect charging/discharging status of the power source unit 1. Therefore, by calculating the ratio ($V_L/V_S$) of the electric leakage voltage $V_L$ to the reference electrical potential difference $V_S$, the number of power sources between the reference terminal and the electric leakage occurring position can be more accurately determined.

Second Embodiment

The first embodiment of the electric leakage detection method disclosed herein is described above. The embodiment is not intended to limit the electric leakage detection method disclosed herein, and various changes can be made. For example, in the first embodiment, the second terminal $T_2$ connected to the total negative terminal $16a$ is used as a reference terminal. However, either the first terminal or the second terminal can be used as the reference terminal without particular limitations. In other words, in the circuit shown in FIG. 3, the electric leakage occurring position can be determined based on the ratio ($V_L/V_S$) between the electric leakage voltage $V_L$ and the reference electrical potential difference $V_S$ even when the first terminal $T_1$ connected to the total positive terminal $14a$ is used as a reference terminal. However, the equations (1) and (2) shown in the first embodiment are calculation formulae in the case where the second terminal $T_2$ connected to the total negative terminal $16a$ is used as the reference terminal. In the case where the first terminal $T_1$ connected to the total positive terminal $14a$ is used as the reference terminal, the following equations (1)' and (2) are preferably used, for example. This allows accurate calculation of the electric leakage voltage $V_L$ and determination of the electric leakage occurring position based on the ratio ($V_L/V_S$) between the electric leakage voltage $V_L$ and the reference electrical potential difference $V_S$.

[Math. 10]

$$V_L(t) = (1-k)V_t(t)' \qquad (1)$$

[Math. 11]

$$k = \frac{\frac{V_t(t_1)}{V_t(t_2)}}{\frac{V_g(t_1)}{V_g(t_2)} + \frac{V_t(t_1)}{V_t(t_2)}} \qquad (2)$$

Third Embodiment

Figure 4:
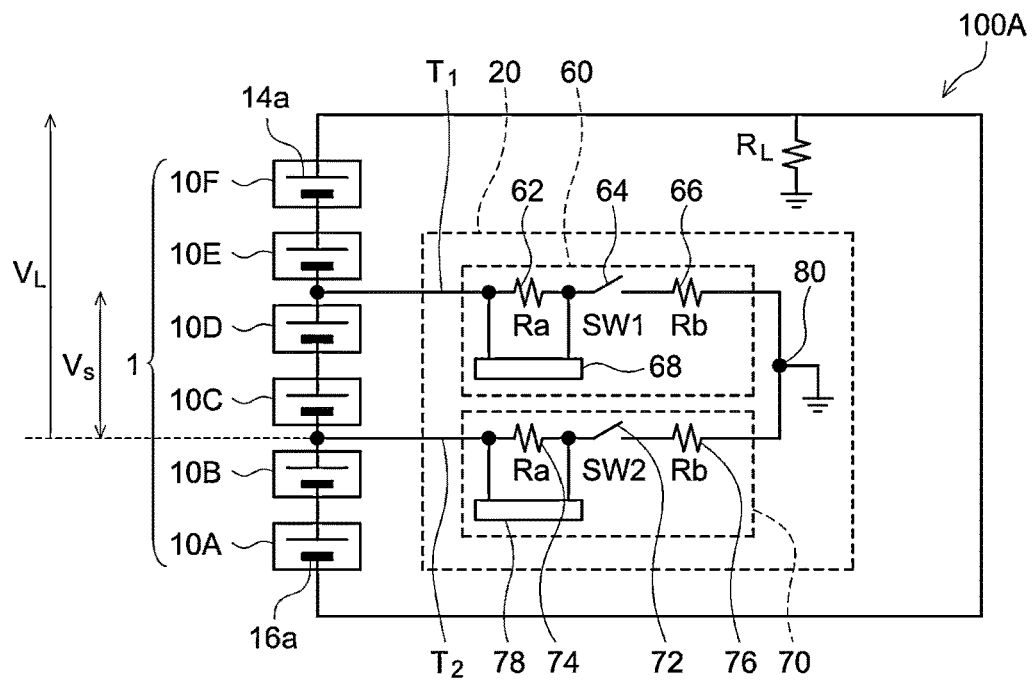
FIG. 4 is a circuit diagram illustrating an electric leakage detection circuit for performing an electric leakage detection method according to a third embodiment.

In the embodiments mentioned above, the first terminal is connected to the total positive terminal, and the second terminal is connected to the total negative terminal. However, the first terminal and the second terminal are not particularly limited as long as they are connected to positions of the power source unit with different electric potentials. The following describes a form in which the first terminal and the second terminal are connected to positions different from the total positive terminal and the total negative terminal. FIG. 4 is a circuit diagram illustrating an electric leakage detection circuit for performing an electric leakage detection method according to a third embodiment. FIG. 4 shows the case where an assembled battery 1 including six single batteries 10A to 10F is an inspection target and an electric leakage occurs in the total positive terminal $14a$, as an example.

As shown in FIG. 4, the first terminal $T_1$ in the third embodiment is connected to a connection member which connects between the fourth single battery 10D and the fifth single battery 10E. The second terminal $T_2$ is connected to a connection member which connects between the second single battery 10B and the third single battery 10C. In other words, in the present embodiment, the third single battery 10C and the fourth single battery 10D are arranged between the first terminal $T_1$ and the second terminal $T_2$. In this case, in the electrical potential difference obtaining, the sum of the voltages of the two single batteries 10C, 10D is measured as a reference electrical potential difference $V_S$. Although not shown in the drawings, the reference electrical potential difference detection unit with the same configuration as the reference numeral 50 of FIG. 3 is connected between the first terminal $T_1$ and the second terminal $T_2$. This allows the reference electrical potential difference $V_S$ (the sum of the voltages of the single batteries 10C, 10D) to be measured.

The electric leakage voltage detection unit 20 shown in FIG. 4 includes a first terminal circuit 60 configured to detect the first ground voltage $V_{g(t1)}$, and a second terminal circuit 70 configured to detect the second ground voltage $V_{g(t2)}$. The first terminal circuit 60 is provided with a first switch 64, a first voltage detection resistor 62, a first voltage dividing resistor 66, and a first voltage detection unit 68. The second terminal circuit 70 is provided with a second switch 72, a first voltage detection resistor 74, a first voltage dividing resistor 76, and a second voltage detection unit 78. The first terminal circuit 60 and the second terminal circuit 70 are connected to each other at a connection point 80, and the connection point 80 is connected to the ground.

In the electric leakage voltage measurement in the third embodiment, firstly, a voltage input to the first voltage detection unit 68 is measured at a first timing $T_1$ when the first switch 64 is turned ON and the second switch 72 is turned OFF. At this time, when an electric leakage occurring position is present in the assembled battery 1, the electric leakage occurring position (in the total positive terminal $14a$) and the first terminal $T_1$ are conducted with each other via the ground and the electric leakage resistor RL, and the first ground voltage $V_{g(t1)}$ is measured. In the present embodiment, a reference electrical potential difference $V_S$ between the first terminal $T_1$ and the second terminal $T_2$ is measured at the first timing $T_1$, and is used as a first reference electrical potential difference $V_{S(T1)}$.

Then, a voltage input to the second voltage detection unit 78 is measured at a second timing $T_2$ when the first switch 64 is turned OFF and the second switch 72 is turned ON. At this time, when an electric leakage occurring position is present in the assembled battery 1, the electric leakage occurring position (in the total positive terminal $14a$) and the second terminal $T_2$ are conducted with each other via the ground and the electric leakage resistor RL, and the second ground voltage $V_{g(t2)}$ is measured. In the present embodiment, the reference electrical potential difference $V_S$ is again measured at the second timing $T_2$, and is used as a second reference electrical potential difference $V_{S(t2)}$.

In the electric leakage voltage measurement of the third embodiment, the electric leakage voltage $V_L$ is calculated based on the following equations (3) and (4). In the present embodiment, the second terminal $T_2$ connected between the second single battery 10B and the third single battery 10C is used as a reference terminal. The electric leakage voltage $V_L$ is an electrical potential difference between the second terminal $T_2$ and the electric leakage occurring position (the total positive terminal $14a$). At this time, the relationship between the electric leakage voltage $V_L$ and the reference electrical potential difference $V_S$ can be represented by the following equation (3). The "k" in the following equation (3) represents the ratio ($V_L/V_S$) of the electric leakage voltage $V_L$ to the reference electrical potential difference $V_S$.

[Math. 12]

$$V_L(t) = kV_S(t) \qquad (3)$$

[Math. 13]

$$k = \frac{\frac{V_S(t_1)}{V_g(t_1)}}{\frac{V_S(t_1)}{V_g(t_1)} - \frac{V_S(t_2)}{V_g(t_2)}} \qquad (4)$$

The ratio ($k=V_L/V_S$) of the electric leakage voltage $V_L$ to the reference electrical potential difference $V_S$ calculated in the present embodiment is a numerical value in the range of −1 or more to 2 or less. For example, when an electric leakage is occurring at a position near the total positive terminal 14a as viewed from the reference terminal (the second terminal $T_2$), the "k" will be a value in plus. When an electric leakage is occurring at a position near the total negative terminal 16a as viewed from the reference terminal, the "k" will be a value in minus. Thus, in the present embodiment, an electrical potential from the reference terminal to the electric leakage occurring position can be determined based on the ratio ($k=V_L/V_S$) of the electric leakage voltage $V_L$ to the reference electrical potential difference $V_S$.

Fourth Embodiment

Figure 5:
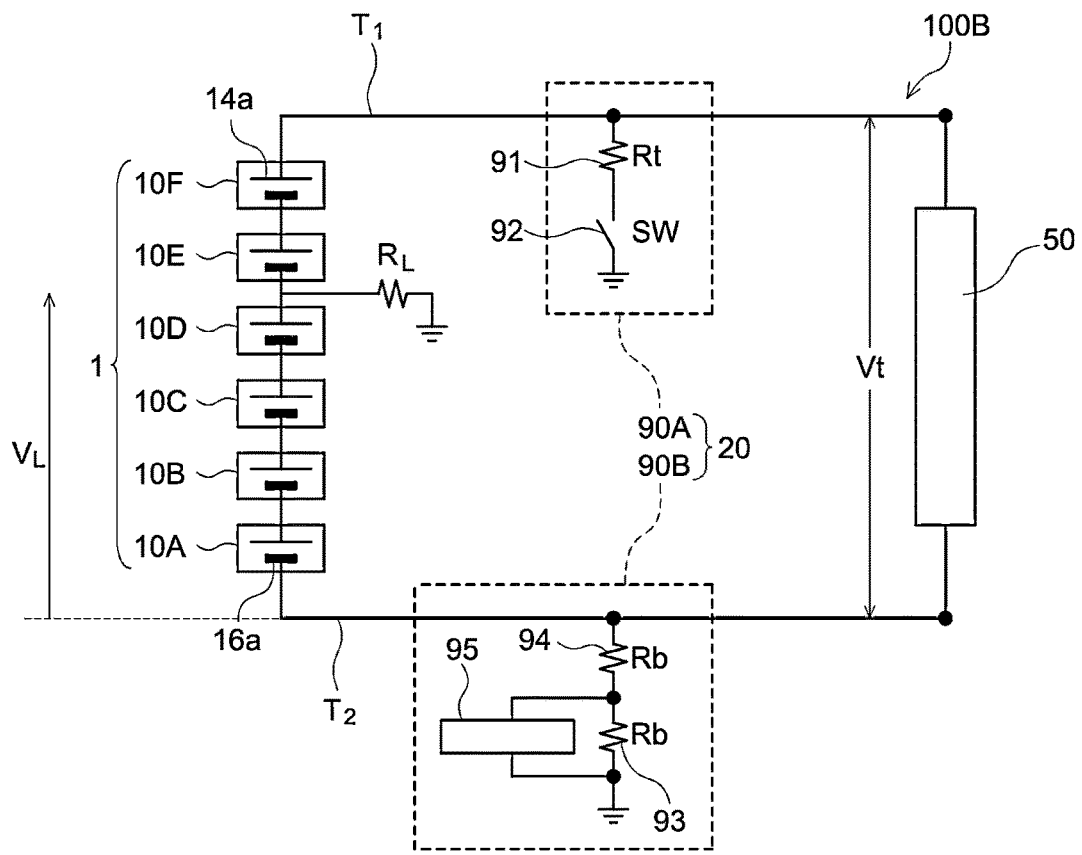
FIG. 5 is a circuit diagram illustrating an electric leakage detection circuit for performing an electric leakage detection method according to a fourth embodiment.

The electric leakage detection method disclosed herein is not limited to the form of using a specific circuit and a calculation formula, as long as the electric leakage position is determined based on the electric leakage voltage $V_L$. In other words, the electric leakage detection method disclosed herein can be performed if the electric leakage voltage $V_L$ can be detected even if a circuit with a structure different from the electric leakage detection circuit shown in FIG. 3 or FIG. 4 is used and equations different from the equations (1) to (4) are used. The following describes another example of the electric leakage detection circuit which can detect the electric leakage voltage $V_L$ with reference to FIG. 5. FIG. 5 shows the case where an assembled battery 1 including six single batteries 10A to 10F is an inspection target and an electric leakage is occurring in a connection member between the fourth single battery 10D and the fifth single battery 10E, as an example.

Also in the fourth embodiment, the reference electrical potential difference $V_S$ is detected, and the ratio ($V_L/V_S$) of the electric leakage voltage $V_L$ to the reference electrical potential difference $V_S$ is calculated. In the electric leakage detection circuit 100B according to the fourth embodiment, the first terminal $T_1$ is connected to the total positive terminal 14a, and the second terminal $T_2$ is connected to the total negative terminal 16a. A reference electrical potential difference detection unit 50 is connected between the first terminal $T_1$ and the second terminal $T_2$. Thus, also in the present embodiment, the total voltage $V_t$ of the assembled battery is detected as the reference electrical potential difference $V_S$. In the present embodiment, the second terminal $T_2$ connected to the total negative terminal 16a is used as a reference terminal.

The electric leakage voltage detection unit 20 of the fourth embodiment includes: a pseudo electric leakage circuit 90A; and a voltage detection circuit 90B. The pseudo electric leakage circuit 90A is a circuit which connects between the first terminal $T_1$ and the ground. The pseudo electric leakage circuit 90A is provided with a test resistor 91 and a switch 92. The voltage detection circuit 90B is a circuit which connects between the second terminal $T_2$ (the reference terminal) and the ground. The voltage detection circuit 90B is provided with a voltage detection resistor 93 and a voltage dividing resistor 94. The voltage detection circuit 90B is further provided with a voltage detection unit 95 configured to detect a voltage in the voltage detection resistor 93. In the electric leakage voltage detection unit 20 with the configuration, the pseudo electric leakage circuit 90A, the voltage detection circuit 90B and the electric leakage occurring position (a connection member between the fourth single battery 10D and the fifth single battery 10E) are connected to each other via the ground.

The following describes electric leakage voltage measurement in the case of using the electric leakage detection circuit 100B with the configuration.

Figure 6:
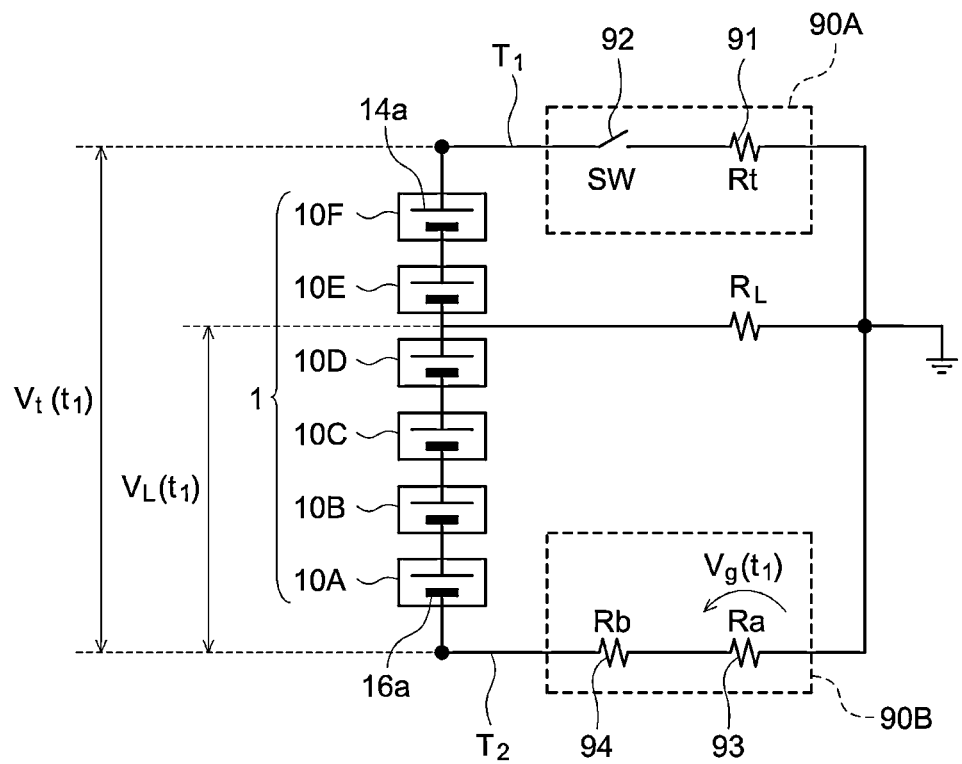
FIG. 6 is a schematic view of an electroconductive path at a first timing of the electric leakage detection circuit shown in FIG. 5.

In the electric leakage voltage measurement of the present embodiment, firstly, the switch 92 of the pseudo electric leakage circuit 90A is turned OFF. FIG. 6 shows an electroconductive path at the first timing $T_1$. As shown in FIG. 6, when an electric leakage is occurring in the assembled battery 1 at the first timing $T_1$, the electric leakage occurring position and the second terminal $T_2$ are conducted with each other via the ground and the electric leakage resistor, and the first ground voltage $V_{g(t1)}$ is measured. At the first timing $T_1$, the total voltage $V_t$ (the reference electrical potential difference $V_S$) of the assembled battery 1 is also measured, and is used as the first total voltage $V_{t(t1)}$. The electric leakage voltage $V_L$ ($T_1$) at the first timing $T_1$ is represented by the following equation (6). The "k" in the equation (6) represents the ratio ($V_L/V_t$) of the electric leakage voltage $V_L$ to the total voltage $V_t$ as in the first embodiment, and is a numerical value in the range of 0 or more to 1 or less.

[Math. 14]

$$V_L(t_1) = kV_t(t_1) \qquad (6)$$

The electric leakage detection circuit 100B at the first timing $T_1$ is a close circuit including first to fourth single batteries 10A to 10D, an electric leakage resistor RL, a voltage detection resistor 93, and a voltage dividing resistor 94 as shown in FIG. 6. At this time, the first ground voltage $V_{g(t1)}$ is represented by the following equation (7). In the equation (7), Ra represents a resistance value of the voltage detection resistor 93, Rb represents a reference value of the voltage dividing resistor 94, and RL represents a resistance value of an electric leakage resistor.

[Math. 15]

$$\frac{R_a}{R_a + R_b + R_L} V_L(t_1) = -V_g(t_1) \qquad (7)$$

Figure 7:
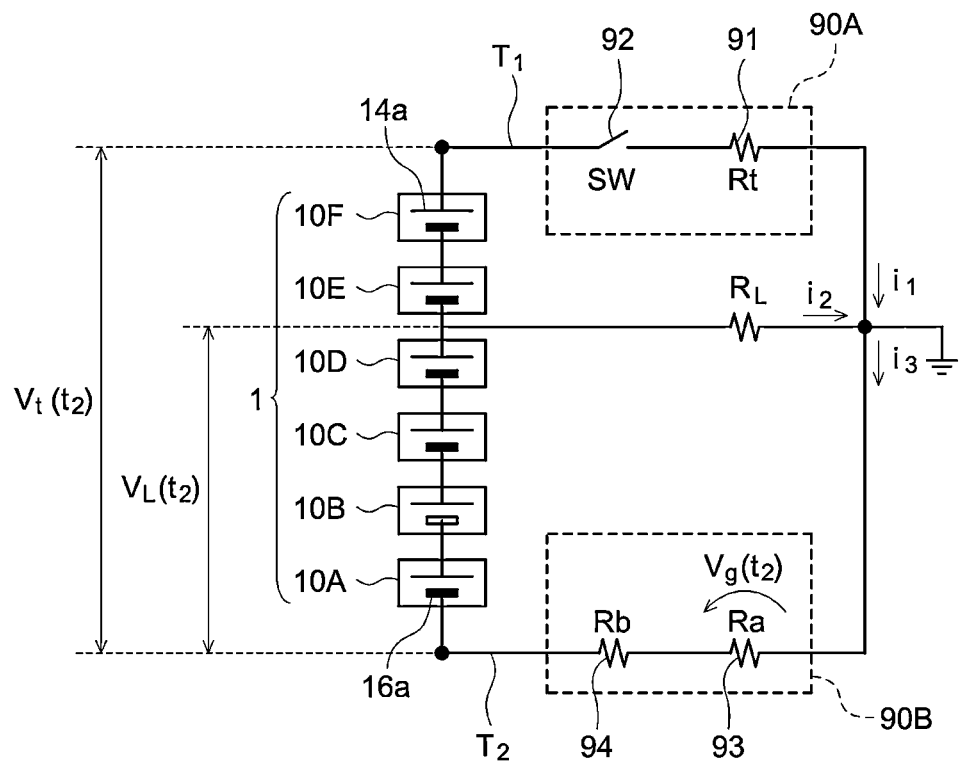
FIG. 7 is a schematic view of an electroconductive path at a second timing of the electric leakage detection circuit shown in FIG. 5.

In the electric leakage voltage measurement of the present embodiment, next, the switch 92 of the pseudo electric leakage circuit 90A is turned ON. FIG. 7 shows an electroconductive path at the second timing $T_2$. As shown in FIG. 7, when an electric leakage is occurring in the assembled battery 1, also at the second timing $T_2$, the electric leakage occurring position and the second terminal $T_2$ are conducted with each other via the ground and the electric leakage resistor, and the second ground voltage $V_{g(t2)}$ is measured. Also at the second timing $T_2$, the total voltage $V_t$ (the reference electrical potential difference $V_S$) of the assembled battery is measured, and is used as the second total voltage $V_{t(t2)}$. The electric leakage voltage $V_{L(t2)}$ at the second timing $T_2$ is represented by the following equation (8).

[Math. 16]

$$V_L(t_2) = k V_t(t_2) \tag{8}$$

At the second timing $T_2$ when the switch 92 is turned on, a current $i_1$ that has passed through the test resistor 91 of the pseudo electric leakage circuit 90A from the total positive terminal 14a and a current $i_2$ flowing from the electric leakage occurring position flows through the voltage detection resistor 93 of the voltage detection circuit 90B via the ground. Thus, the second ground voltage $V_{g(t2)}$ measured at the second timing $T_2$ is calculated by procedures different from the procedures by which the first ground voltage $V_{g(t1)}$ is measured. The following describes processes of calculating the second ground voltage $V_{g(t2)}$.

A current i3 flowing into the voltage detection resistor 93 at the second timing $T_2$ is, as shown in the following equation (9), a sum of the current $i_1$ which has passed through the test resistor 91 and the current $i_2$ flowing from the electric leakage occurring position.

[Math. 17]

$$i_3 = i_1 + i_2 \tag{9}$$

The difference $(V_{t(t2)} - V_{L(t2)})$ between the total voltage $V_{t(t2)}$ and the electric leakage voltage $V_{L(t2)}$ of the assembled battery at the second timing $T_2$ is calculated based on the resistance value RL of the electric leakage resistor, the current $i_2$ flowing from the electric leakage occurring position, the resistance value Rt of the test resistor 91, and the current $i_1$ which has passed through the test resistor 91 (see the following equation (10)).

[Math. 18]

$$V_t(t_2) - V_L(t_2) = -R_L i_2 + R_t i_1 \tag{10}$$

Next, the electric leakage voltage $V_{L(t2)}$ at the second timing $T_2$ is calculated based on the resistance value Ra of the voltage detection resistor 93, the resistance value Rb of the voltage dividing resistor 94, the current i3 flowing into the voltage detection resistor 93, the resistance value RL of the electric leakage resistor, and the current $i_2$ flowing from the electric leakage occurring position (see the following equation (11)).

[Math. 19]

$$V_L(t_2) = (R_a + R_b) i_3 + R_L i_2 \tag{11}$$

Then, the second ground voltage $V_{g(t2)}$ at the second timing $T_2$ is calculated based on the resistance value Ra of the voltage detection resistor 93 and the current i3 flowing into the voltage detection resistor 93 (see the following equation (12)).

[Math. 20]

$$R_a i_3 = -V_g(t_2) \tag{12}$$

When the "current i3" derived by the simultaneous equations (9) to (11) is substituted for "i3" in the equation (12), the following equation (13) is obtained. The value of the second ground voltage $V_{g(t2)}$ can be calculated by the equation (13).

[Math. 21]

$$R_a \frac{V_L(t_2) + \frac{R_L}{R_L + R_t}(V_t(t_2) - V_L(t_2))}{R_a + R_b + \frac{R_L R_t}{R_L + R_t}} = -V_g(t_2) \tag{13}$$

Next, the processes of calculating the ratio $(V_L/V_t)$ of the electric leakage voltage $V_L$ to the reference electrical potential difference $V_S$ (the total voltage $V_t$) in the present embodiment will be described. When "Ra+Rb" in each equation described above is represented by "R," and "$V_{g(t1)}/V_{t(t1)}$" is represented by "V1," the ratio k $(=V_L/V_t)$ at the first timing $T_1$ is represented by the following equation (14) based on the simultaneous equations (6) and (7).

[Math. 22]

$$k = -\frac{R + R_L}{R_a} V_1 \tag{14}$$

When "Ra+Rb" in each equation described above is represented by "R," and "$V_{g(t2)}/V_{t(t2)}$" is represented by "V2," the ratio k $(=V_L/V_t)$ at the second timing $T_2$ is represented by the following equation (15) based on the simultaneous equations (8) and (13).

[Math. 23]

$$k = -\frac{R}{R_a} \frac{R_L + R_t}{R_t} V_2 - \frac{R_L}{R_a} V_2 - \frac{R_L}{R_t} \tag{15}$$

The following equation (16) is obtained by combining the equations (14) and (15). The value of the electric leakage resistor RL can be calculated by the equation (16).

[Math. 24]

$$R_L = \frac{1}{\frac{1}{R_t} \cdot \frac{1}{V_1 - V_2}\left(V_2 + \frac{R_a}{R}\right) - \frac{1}{R}} \tag{16}$$

The real number of the ratio k $(=V_L/V_t)$ of the electric leakage voltage $V_L$ to the reference electrical potential difference $V_S$ (the total voltage $V_t$) can be obtained by substituting the value of the electric leakage resistor RL calculated based on the equation (16) for the equation (14). As in the first to third embodiments, if the real number of the ratio $(V_L/V_S)$ of the electric leakage voltage $V_L$ to the reference electrical potential difference $V_S$ is determined, an electrical potential from the reference terminal (the second terminal $T_2$) to the electric leakage occurring position can be determined in a simplified manner. As described above, even in the case of using the electric leakage detection circuit 100B with the configuration such as shown in FIG. 5, the ratio $V_L/V_S$ of the electric leakage voltage $V_L$ to the reference electrical potential difference $V_S$ can be calculated, as appropriate, and the electric leakage occurring position can be accurately determined.

<Other Changes>

In the first to fourth embodiments, an assembled battery is shown as an example of the power source unit which is an inspection target. However, the configuration of the power source unit does not limit the electric leakage detection method disclosed herein. For example, as mentioned above, the electric leakage detection method disclosed herein is applicable to the power source unit including multiple power generation elements (e.g., solar cells) connected to each other. In the embodiments, a power source unit (assembled battery) including power sources (single batteries) all of which are connected in series is an inspection target. However, it is not necessary that all of the power sources constituting the power source unit which is an inspection target are connected in series. For example, the electric leakage detection method disclosed herein is applicable to the power source unit in which multiple parallel power source groups in each of which multiple power sources are connected in parallel are connected in series. In such a case, it is simply determined which parallel power source group is causing the electric leakage. As a specific example, the electric leakage detection method disclosed herein can be used suitably for determination of the electric leakage occurring position in the power source unit including multiple (suitably 30 or more, more suitably 90 or more) power sources connected to each other in series.

In the first to fourth embodiments, a reference electrical potential difference $V_S$ which is an electrical potential difference between the first terminal and the second terminal is obtained, and the electric leakage occurring position is determined based on the ratio ($V_L/V_S$) of the electric leakage voltage $V_L$ to the reference electrical potential difference $V_S$. However, the electric leakage detection method disclosed herein is not limited to a form using the reference electrical potential difference $V_S$ as long as the electric leakage occurring position is determined based on the electric leakage voltage $V_L$. Specifically, the electric leakage voltage $V_L$ is an electrical potential difference between the reference terminal and the electric leakage occurring position. Thus, the number of power sources present between the reference terminal and the electric leakage occurring position can be determined to some extent without determining the ratio ($V_L/V_S$) to the reference electrical potential difference $V_S$. As an example, voltages of the power sources can be calculated based on the SOC when an electric leakage occurs in the power source unit, and can then be converted into the number of power sources present between the reference terminal and the electric leakage occurring position. If highly accurate determination of the position is not necessary, the electric leakage occurring position may be specified based on the ratio between the rated voltage of the power source unit and the electric leakage voltage $V_L$.

Although the technology disclosed herein has been described in detail above with specific embodiments, it is a mere example and does not limit the appended claims. The technology described is the appended claims include various modifications and changes of the foregoing embodiments.

What is claim is:

1. An electric leakage detection circuit configured to detect an electric leakage occurring position in a power source unit including multiple power sources electrically connected to each other, the electric leakage detection circuit comprising:
    a reference terminal connected to a predetermined position of the power source unit;
    an electric leakage voltage detection unit configured to calculate an electric leakage voltage $V_L$ which is an electrical potential difference between the reference terminal and the electric leakage occurring position; and
    an electric leakage occurring position determination unit configured to determine the electric leakage occurring position based on the electric leakage voltage $V_L$.

2. The electric leakage detection circuit according to claim 1, further comprising:
    a reference electrical potential difference detection unit configured to detect a reference electrical potential difference $V_S$ which is an electrical potential difference between a first terminal connected to the power source unit and a second terminal connected to the power source unit at a position with a different electrical potential from the first terminal, wherein
    the electric leakage voltage detection unit is configured to
        select either one of the first terminal or the second terminal as the reference terminal, and
        calculate the electric leakage voltage $V_L$, and
    the electric leakage occurring position determination unit is configured to determine the electric leakage occurring position based on a ratio ($V_L/V_S$) of the electric leakage voltage $V_L$ to the reference electrical potential difference $V_S$.

3. The electric leakage detection circuit according to claim 2, wherein
    the reference electrical potential difference detection unit is connected between the first terminal and the second terminal; and
    the electric leakage voltage detection unit is connected to the first terminal and the second terminal and connected to ground at a midpoint of the electric leakage voltage detection unit, and configured to detect
        a first ground voltage $V_{g(t1)}$ corresponding to an electrical potential difference between the first terminal via the ground and the electric leakage occurring position, and
        a second ground voltage $V_{g(t2)}$ corresponding to an electrical potential difference between the second terminal via the ground and the electric leakage occurring position.

4. The electric leakage detection circuit according to claim 3, wherein
    the electric leakage voltage detection unit includes:
        a first switch connected to the first terminal side;
        a first voltage detection resistor provided between the first switch and the midpoint;
        a second switch connected to the second terminal side; and
        a second voltage detection resistor provided between the second switch and the midpoint.

5. The electric leakage detection circuit according to claim 4, wherein
    the power source unit further includes:
        a total positive terminal which is a positive electrode terminal open to be connectable with an external device; and
        a total negative terminal which is a negative electrode terminal open to be connectable with the external device, and
    the first terminal is connected to the total positive terminal, the second terminal is connected to the total negative terminal, and a total voltage $V_t$ of the power source unit, which is an electrical potential difference between the total positive terminal and the total negative terminal, is the reference electrical potential difference $V_S$.

6. The electric leakage detection circuit according to claim 5, wherein the reference electrical potential difference detection unit is configured to measure a first total voltage $V_{t(t1)}$ while detecting the first ground voltage $V_{g(t1)}$ in the electric leakage voltage detection unit with the first switch ON and the second switch OFF;

the reference electrical potential difference detection unit is configured to measure a second total voltage $V_{t(t2)}$ while detecting the second ground voltage $V_{g(t2)}$ in the electric leakage voltage detection unit with the first switch OFF and the second switch ON; and the electric leakage voltage detection unit is configured to calculate the electric leakage voltage $V_L$ based on the first ground voltage $V_{g(t1)}$, the first total voltage $V_{t(t1)}$, the second ground voltage $V_{g(t2)}$, and the second total voltage $V_{t(t2)}$.

7. The electric leakage detection circuit according to claim 6, wherein the electric leakage voltage $V_L$ at timing (t) is calculated based on equation (1)

$$V_L(t) = kV_t(t) \tag{1}$$

[equation 2]

$$k = \frac{\frac{V_t(t_1)}{V_t(t_2)}}{\frac{V_g(t_1)}{V_g(t_2)} + \frac{V_t(t_1)}{V_t(t_2)}} \tag{2}$$

with the total negative terminal as the reference terminal.

8. The electric leakage detection circuit according to claim 6, wherein the electric leakage voltage $V_L$ at timing (t) is calculated based on equation (1)'

$$V_L(t) = (1-k)V_t(t)' \tag{1}$$

[equation 2]

$$k = \frac{\frac{V_t(t_1)}{V_t(t_2)}}{\frac{V_g(t_1)}{V_g(t_2)} + \frac{V_t(t_1)}{V_t(t_2)}} \tag{2}$$

with the total positive terminal as the reference terminal.

9. The electric leakage detection circuit according to claim 4, wherein the power source unit includes multiple connection members electrically connecting between two adjacent power sources of the multiple power sources, and the first terminal is connected to one of the multiple connection members, and the second terminal is connected to a connection member of the multiple connection members different from that connected to the first terminal.

10. The electric leakage detection circuit according to claim 9, wherein the electric leakage voltage $V_L$ at timing (t) is calculated based on equation (3)

$$V_L(t) = kV_S(t) \tag{3}$$

[equation 4]

$$k = \frac{\frac{V_S(t_1)}{V_g(t_1)}}{\frac{V_S(t_1)}{V_g(t_1)} - \frac{V_S(t_2)}{V_g(t_2)}} \tag{4}$$

with the second terminal as the reference terminal.

* * * * *